US012772517B2

(12) United States Patent
Saggio et al.

(10) Patent No.: US 12,772,517 B2
(45) Date of Patent: Oct. 20, 2026

(54) 4H-SiC MOSFET DEVICE AND MANUFACTURING METHOD THEREOF

(71) Applicant: STMicroelectronics S.r.l., Agrate Brianza (IT)

(72) Inventors: Mario Giuseppe Saggio, Aci Bonaccorsi (IT); Edoardo Zanetti, Valverde (IT); Alfio Guarnera, Trecastagni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1179 days.

(21) Appl. No.: 17/741,310

(22) Filed: May 10, 2022

(65) Prior Publication Data

US 2022/0344467 A1 Oct. 27, 2022

Related U.S. Application Data

(62) Division of application No. 17/096,635, filed on Nov. 12, 2020, now Pat. No. 11,329,131.

(30) Foreign Application Priority Data

Nov. 14, 2019 (IT) ........................ 102019000021204

(51) Int. Cl.
*H10D 30/66* (2025.01)
*H10D 62/13* (2025.01)
*H10D 62/832* (2025.01)

(52) U.S. Cl.
CPC ....... *H10D 62/151* (2025.01); *H10D 62/8325* (2025.01)

(58) Field of Classification Search
CPC ........................... H10D 30/66; H10D 62/8325
See application file for complete search history.

(56) References Cited

U.S. PATENT DOCUMENTS

| | | | |
|---|---|---|---|
| 5,463,241 | A | 10/1995 | Kubo |
| 2003/0218210 | A1 | 11/2003 | Tagami et al. |
| 2007/0138550 | A1 | 6/2007 | Ninomiya et al. |
| 2011/0057202 | A1 | 3/2011 | Kono et al. |
| 2012/0223338 | A1 | 9/2012 | Mitani et al. |

(Continued)

FOREIGN PATENT DOCUMENTS

| | | | |
|---|---|---|---|
| JP | 2006-66439 | A | 3/2006 |
| WO | 2017/169777 | A1 | 10/2017 |

*Primary Examiner* — Ali Naraghi
(74) *Attorney, Agent, or Firm* — Seed Intellectual Property Law Group LLP

(57) ABSTRACT

A MOSFET device includes a semiconductor body having a first and a second face. A source terminal of the MOSFET device includes a doped region which extends at the first face of the semiconductor body and a metal layer electrically coupled to the doped region. A drain terminal extends at the second face of the semiconductor body. The doped region includes a first sub-region having a first doping level and a first depth, and a second sub-region having a second doping level and a second depth. At least one among the second doping level and the second maximum depth has a value which is higher than a respective value of the first doping level and the first maximum depth. The metal layer is in electrical contact with the source terminal exclusively through the second sub-region.

16 Claims, 5 Drawing Sheets

(56) References Cited

U.S. PATENT DOCUMENTS

| | | | | |
|---|---|---|---|---|
| 2014/0063934 | A1* | 3/2014 | Oh | G06F 13/4068 365/182 |
| 2014/0264568 | A1* | 9/2014 | Kim | H10B 12/09 257/330 |
| 2016/0141371 | A1 | 5/2016 | Tega et al. | |
| 2017/0077285 | A1* | 3/2017 | Uehara | H10D 62/8325 |
| 2017/0125422 | A1* | 5/2017 | Kang | H10B 12/053 |
| 2017/0271442 | A1 | 9/2017 | Uehara | |
| 2018/0053769 | A1* | 2/2018 | Kim | H10B 12/053 |
| 2018/0090574 | A1 | 3/2018 | Matsumura et al. | |
| 2018/0138274 | A1 | 5/2018 | Ohse et al. | |
| 2018/0337273 | A1* | 11/2018 | Losee | H10D 30/665 |
| 2021/0320008 | A1* | 10/2021 | Kim | H10B 12/053 |

* cited by examiner

4H-SiC MOSFET DEVICE AND MANUFACTURING METHOD THEREOF

BACKGROUND

Technical Field

The present disclosure relates to a MOSFET device and a manufacturing method thereof.

Description of the Related Art

FIG. 1 shows a basic structure of a vertical MOSFET device 1, in lateral view and in a tri-axial reference system of orthogonal axis X, Y, Z. In a typical embodiment, the MOSFET device 1 includes a plurality of these basic structures that work together, sharing a same drain terminal (D), with all gate terminals (G) connected together by a deposited polysilicon mesh (not shown), and all of the source terminals (S) electrically connected and linked by a top metal layer 10.

As depicted in FIG. 1, the MOSFET device 1 comprises a semiconductor body 2, of semiconductor material (which includes a substrate and, optionally, one or more epitaxial layers), having a top surface 2*a* and a bottom surface 2*b*. The semiconductor body 2 is, e.g., N− doped. At the bottom surface 2*b*, a drain region 4 is formed, e.g., by implanting dopant species of N-type (doped N+). At the top surface 2*a* body regions 5 (P doped) surround source regions 8 (N+ doped). Gate structures 6, including a stack formed by a gate conductive layer 6*a* and a gate dielectric layer 6*b*, extend on the top surface 2*a*, overlapping in part the source regions 8. A respective isolating layer 9 covers the gate structures 6.

The top metal layer 10 electrically contacts the source regions 8 and the body regions 5 at superficial portions 16 and 17 respectively, in order to bias, during use, the source regions 8 and the body regions 5 at a same biasing voltage.

To improve the electrical contact between the top metal layer 10 and the body regions 5, a P-well region (P+ doped) 14 is formed in some of the body regions 5 and facing the top surface 2*a* in a region corresponding to the superficial portion 17. Typically a silicide interfacing layer (not shown) is formed at the superficial portion 17, to form an ohmic contact between the metal 10 and the implanted P-well region 14. The P-well region 14 is formed only where the metal layer 10 is designed to contact the body regions 5. The P-well region 14 is arranged between source regions 8, in a respective body region 5.

Where, by design, it has been decided to form the contact between the top metal layer 10 and the source regions 8 (i.e., at the superficial region 16), the respective source region 8 extends continuously within the body region 5 which houses it, facing the top surface 2*a* in correspondence of the superficial region 16. Further layers, to enhance the electrical contact between the metal 10 and the source 8 may be formed, in a per se known way and not shown.

During the ON state of the MOSFET device 1, while gate-source voltage VDS is above threshold, a conduction current is localized in the drain region 4 and in the region of the semiconductor body 2 below the gate structure 6 (channel 18). During OFF state of the MOSFET device 1, the voltage drop across the drain D and source S is sustained by a PN junction at reverse bias, and a very small current (leakage) flows through the PN junction. If the voltage increases too much and the electrical field reaches a critical value, the PN junction goes into breakdown, and the current starts to flow through the body region 5. If an overvoltage is applied to the PN junction, a current flows through it while the MOSFET device 1 limits the actual drain-source breakdown voltage ($BV_{DS}$). The breakdown mechanism itself is not destructive for a PN junction. However, overheating caused by the high breakdown current and voltage damages the PN junction unless sufficient heat sinking is provided.

Considering the MOSFET structure in greater detail, one can see that the PN junction is not a "perfect diode". The diode is the collector-base junction of a Bipolar Junction Transistor (BJT), also called the parasitic transistor, made by the N+ source 8, P/P+ body 5, and N+ drain 4, with the base shorted to the emitter by the metal layer 10. The capability of a MOSFET to withstand the avalanche condition takes into account these concerns.

The avalanche capability of the device is usually evaluated by using a circuit that performs an Unclamped Inductive Switching (UIS) operation. During tests, two kinds of failure arise: one is related to current, and the other to power dissipation. In the former, failure is caused by the latching of the parasitic bipolar due to the current that flows through its base resistance, multiplied by the gain. The second is reached when the temperature of the junction rises to a critical value that causes the formation of hot spots by regenerative thermal runaway, with average temperatures of about 650° C., that peak at approximately 1000° C., which then triggers extremely rapid device destruction.

As is known, semiconductor materials, which have a wide forbidden band gap, in particular, which have an energy value Eg of the forbidden band gap greater than 1.1 eV, low on-state resistance ($R_{ON}$), high value of thermal conductivity, high operating frequency, and high velocity saturation of charge carriers, are ideal for producing electronic components, such as diodes or transistors, in particular for power applications. A material having said characteristics, and designed to be used manufacturing electronic components, is silicon carbide (SiC). In particular, silicon carbide, in its different polytypes (e.g., 3C—SiC, 4H—SiC, 6H—SiC), is preferable to silicon as regards the properties listed previously.

Electronic devices provided on a silicon-carbide substrate, as compared to similar devices provided on a silicon substrate, present numerous advantageous characteristics, such as low output resistance in conduction, low leakage current, high working temperature, and high working frequencies.

However, the above issues are not fully overcome by the use of SiC and, to improve the avalanche capability of the MOSFET device, common solutions foresee an edge structure having a much higher breakdown threshold with respect to the active area. However, due to limitation of efficiency at the edges of the device, this target is not always feasible.

The resistance in ON-state is furthermore impacted, since the source resistance depends upon the doping value of the source region 8.

BRIEF SUMMARY

In various embodiments, the present disclosure provides a MOSFET device and a manufacturing method thereof, that overcome the drawbacks of the prior art.

According to the present disclosure, a MOSFET device and a manufacturing method thereof are provided.

In at least one embodiment, the present disclosure provides a MOSFET device that includes a semiconductor body having a first and a second face, opposite to one another along a direction. A source terminal includes a doped region which extends at the first face of the semiconductor body and a metal layer electrically coupled to the doped region. A drain terminal extends at the second face of the semiconductor body. The doped region includes a first sub-region having a first doping concentration and a first maximum depth in the semiconductor body, and a second sub-region having a second doping concentration and a second maximum depth in the semiconductor body. At least one of the second doping concentration and the second maximum depth has a respective value which is higher than a value of the first doping concentration and, respectively, the first maximum depth. The metal layer is in electrical contact with the source terminal exclusively through said second sub-region, and the metal layer is in direct physical contact with the source terminal at only the second sub-region of the source terminal.

In at least one embodiment, the present disclosure provides a method for manufacturing a MOSFET device that includes forming a source terminal. Forming a source terminal includes: implanting, at a first face of a semiconductor body, a doped region, and forming a metal layer on the first face of the semiconductor body and electrically coupled to the doped region. The method further includes forming a drain terminal at a second face of the semiconductor body that is opposite the first face along a direction. The implanting the doped region includes forming a first sub-region having a first doping concentration and a first maximum depth in the semiconductor body, and forming a second sub-region having a second doping concentration and a second maximum depth in the semiconductor body. At least one of the second doping level and the second maximum depth has a value which is higher than a respective value of the first doping level and the first maximum depth. The forming the metal layer includes forming the metal layer in electrical contact with the source terminal exclusively through said second sub-region, the metal layer being in direct physical contact with the source terminal at only the second sub-region of the source terminal.

In at least one embodiment, the present disclosure provides a device that includes a semiconductor body having a first surface, and a source terminal including a doped region which extends into the semiconductor body from the first surface and a metal layer electrically coupled to the doped region. The doped region includes a first sub-region having a first doping concentration and a first maximum depth in the semiconductor body, and a second sub-region having a second doping concentration and a second maximum depth in the semiconductor body. The first sub-region extends laterally outward from opposite sides of the second sub-region. A drain terminal extends at the second face of the semiconductor body, and an insulating layer is disposed on the first sub-region of the doped region. At least one of the second doping concentration and the second maximum depth has a respective value which is higher than a value of the first doping concentration and, respectively, the first maximum depth. The metal layer extends in direct contacts with the second sub-region of the doped region from a first lateral edge of the insulating layer to a second lateral edge of the insulating layer.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 2:
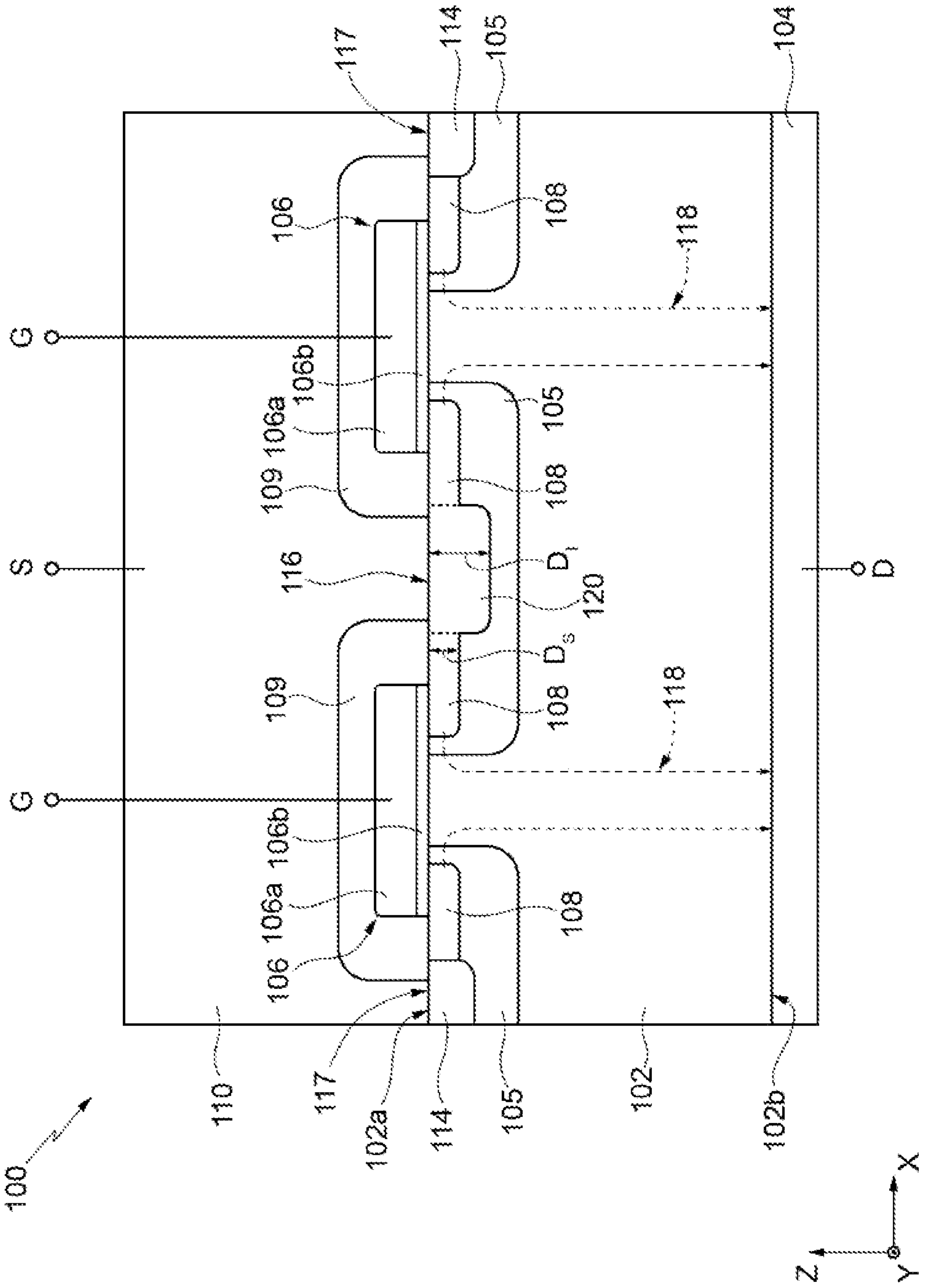
FIG. 2 shows a MOSFET device according to an embodiment of the present disclosure.

FIG. 2 shows a MOSFET device 100 according to an embodiment of the present disclosure.

Figure 1:
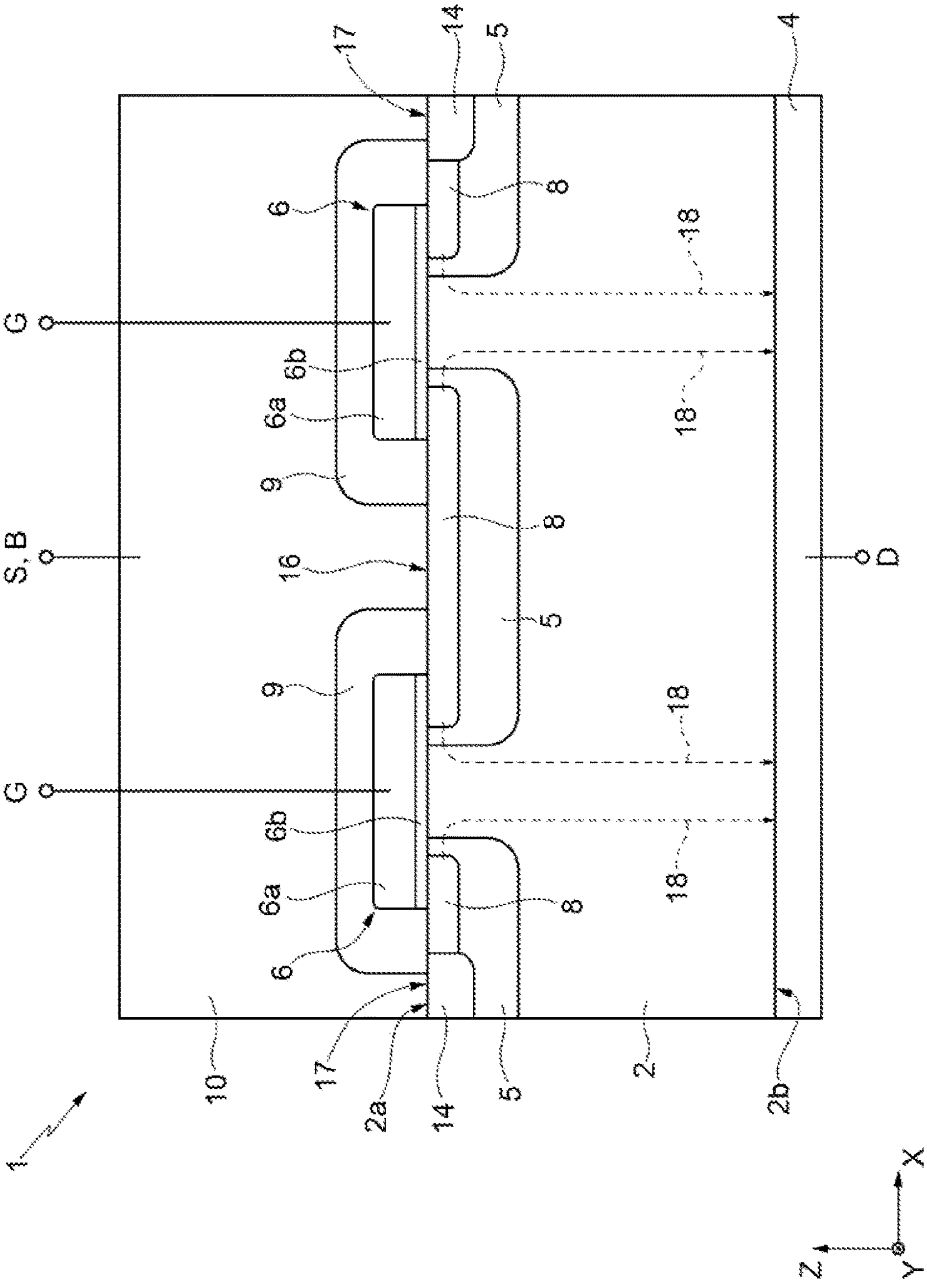
FIG. 1 (Prior Art)
FIG. 1 shows a MOSFET device of a known type.

FIG. 2 is a lateral cross-section view, in the tri-axial reference system of orthogonal axis X, Y, Z of FIG. 1.

As already discussed with reference to FIG. 1, the MOSFET structure shown in FIG. 2 may be a basic structure, or "cell", that can be used to develop an actual MOSFET device 100 by replicating the basic structure a desired number of times; such basic structures work together, sharing a common drain terminal (D), a common gate terminal (G), and a common source terminal (S).

It is apparent that, when replicating the structure of FIG. 2, minimal variations in the basic structure may be introduced, as apparent to the skilled person in the art, for example in order to comply with one or more among design requirements, area occupation, electrical requirements, manufacturing requirements, etc.

As depicted in FIG. 2, the MOSFET device 100 comprises a semiconductor body 102, of semiconductor material (which includes a substrate and, optionally, one or more epitaxial layers), having a top surface 102*a* and a bottom surface 102*b* opposite to one another along axis Z.

In particular, the semiconductor body 102 is made of silicon carbide (SiC), more in particular 4H—SiC. The semiconductor body 102 is, in one embodiment, doped N−.

Facing the bottom surface 102*b* is a drain region 104, e.g., formed by implanted dopant species of N-type (doped N+). Body regions 105 (P doped) are arranged at the top surface 102*a*; in particular, body regions 105 face the top surface 102*a*.

Source regions 108 (N+ doped) are formed by implantation in the semiconductor body 102, within the body regions 105, facing the top surface 102*a*. Therefore, the body regions 105 surround respective source regions 108 formed therein.

Gate structures 106 extend on the top surface 102*a*, and include a stack formed by a gate conductive layer 106*a* (e.g., of metal material) and a gate dielectric layer 106*b* (of insulating or dielectric material). A respective isolating layer 109 covers each gate structures 106, to electrically insulate the gate structures 106 from the metal layer 110. The gate structures 106 overlap in part the source regions 8; a respective channel region 118 is formed, during use, in the region of the semiconductor body 102 below the gate structures 106, between body regions 105/source regions 108, in a per se known way. The current path is pictured in FIG. 2 with dashed line, and goes from the source regions 108 towards the drain region 104 (vertical conduction).

The active area of the MOSFET device 100 is the area where current conduction takes place and, in particular, where the channel is formed. Typically, the active area is surrounded, either completely or partially, by an edge termination region, not shown and per se known. The edge termination region is, e.g., an implanted region having a P conductivity type.

In a way which is not shown in detail and which is known to the skilled person, all gate structures 106 are electrically connected together (e.g., by a deposited polysilicon mesh), and all of the source regions 108 are electrically connected together and/or electrically linked to one another within the semiconductor body 102.

The top metal layer 110 is in electrical contact with the source regions 108 and the body regions 105 at respective selective regions, in order to bias, during use, the source regions 108 and the body regions 105 at a same biasing voltage.

To improve the electrical contact between the top metal layer 110 and the body regions 105, a P-well region (P+ doped) 114 is formed in one or more body regions 105, at the top surface 2*a*, and form a respective electrical-contact interface 117. Typically, each electrical-contact interface 117 also includes a silicide interfacing layer (not shown), to form an ohmic contact between the top metal layer 110 and the respective P-well region 114. The P-well region 114 is formed where the metal layer 110 reaches the top surface 102*a* to contact the body regions 105. The P-well region 114 is arranged between source regions 108 extending in a same body region 105.

According to an aspect of the present disclosure, an electrical-contact interface 116 is defined between the top metal layer 110 and the region of the semiconductor body where, by design, it has been decided to form the contact between the top metal layer 110 and the source regions 108.

The electrical contact between the source regions 108 and the top metal layer 110 is guaranteed by an intermediate electrical-contact region 120, which is direct electrical contact with at least one source region 108 on a side and with the top metal layer 110 on another side (one or more interface layer to improve the ohmic contact may in any case be formed between the intermediate electrical-contact region 120 and the top metal layer 110). In other words, the electrical contact between the top metal layer 110 and the source regions 108 is exclusively made through (or by means of) the intermediate electrical-contact region 120.

The intermediate electrical-contact region 120 is, in one embodiment, an implanted region of N-type, with a doping level (or doping dose) higher than the doping level (or doping dose) of the source regions 108. Moreover, the intermediate electrical-contact region 120 extends into the semiconductor body 102 for a depth $D_I$ (measured along Z axis from the top surface 102*a*) which is higher than the depth $D_S$ (measured along Z axis from the top surface 102*a*) reached by the source regions 108.

Therefore, the intermediate electrical-contact region 120 is in direct lateral electrical contact with the source regions 108 extending within the same body region 105 (i.e., the intermediate electrical-contact region 120 is in direct electrical contact with the source regions 108 along axis X). More specifically, the intermediate electrical-contact region 120 and the source regions 108 extending within the same body region 105 are in electrical continuity.

According to the present disclosure, the doping level of the intermediate electrical-contact region 120 is higher than the doping level (i.e., doping concentration) of source regions 108.

In one embodiment, the doping level of the intermediate electrical-contact region 120 is in the range $1\cdot10^{19}$-$1\cdot10^{20}$ atoms/cm$^3$, while the doping level of the source regions 108 is in the range $1\cdot10^{18}$-$1\cdot10^{20}$ atoms/cm$^3$. The actual values are chosen in the indicated ranges, and do not overlap. Moreover, in this embodiment, the depth $D_I$ of the intermediate electrical-contact region 120 is higher than the depth $D_S$ of source regions 108. For example, the depth $D_S$ of the source regions 108 is in the range 0.2-0.4 μm, while the depth $D_I$ of the intermediate electrical-contact region 120 is in the range 0.6-0.7 μm. According to this embodiment, the punch-through of the junction n−/p/n+ (elements with reference numerals 102/105/120 in the drawings) leads to a uniform avalanche condition in the active area (under UIS tests as well as in static conditions).

In another embodiment, the doping levels of the intermediate electrical-contact region 120 and of the source regions 108 are the same or approximately the same, in the range $1\cdot10^{19}$-$1\cdot10^{20}$ atoms/cm$^3$. Moreover, in this embodiment, the depth $D_I$ of the intermediate electrical-contact region 120 is higher than the depth $D_S$ of source regions 108. For example, the depth $D_S$ of the source regions 108 is in the range 0.1-0.2 μm, while the depth $D_I$ of the intermediate electrical-contact region 120 is higher than 0.2 (e.g., in the range 0.2 and 0.4 μm). The actual values are chosen in such a way that they do not overlap. This embodiment has been found to increase the ruggedness during short-circuit tests. In fact, this structure allows to modulate the saturation current of the MOSFET device 120 with minimum impact on the output resistance of the MOSFET device 120.

In still another embodiment, the doping level of the intermediate electrical-contact region 120 is in the range $1\cdot10^{19}$-$1\cdot10^{20}$ atoms/cm$^3$, while the doping level of the source regions 108 is in the range $1\cdot10^{18}$-$2\cdot10^{19}$ atoms/cm$^3$ (in general terms, the doping level of region 108 ranges from 1% to 20% of the doping level of region 120). The actual values are chosen in the indicated ranges, and do not overlap. Moreover, in this embodiment, the depth $D_I$ of the intermediate electrical-contact region 120 is in the range 0.2-0.4 μm, while the depth $D_S$ of source regions 108 is in the range 0.1-0.4 μm (in general terms, $D_S$ ranges from 25% to 100% of $D_I$). This embodiment has been found to increase the ruggedness during short-circuit tests. In fact, this structure allows to modulate the saturation current of the MOSFET device 120 without impacting undesirably on the output resistance of the MOSFET device 120.

In still another embodiment, the doping level of the intermediate electrical-contact region 120 is in the range $1\cdot10^{19}$-$1\cdot10^{20}$ atoms/cm$^3$, while the doping level of the source regions 108 is in the range $1\cdot10^{18}$-$2\cdot10^{19}$ atoms/cm$^3$ (in general terms, the doping level of region 108 ranges from 1% to 20% of the doping level of region 120). The actual values are chosen in the indicated ranges, and do not overlap. Moreover, in this embodiment, the depth $D_I$ of the intermediate electrical-contact region 120 is in the range 0.6-0.7 μm, while the depth $D_S$ of source regions 108 is in the range 0.1-0.4 μm (in general terms, $D_S$ ranges from 15% to 60% of $D_I$). According to this embodiment, the punch-through of the junction n−/p/n+ (elements with reference numerals 102/105/120 in the drawings) leads to a uniform avalanche condition in the active area (under UIS tests). Furthermore, this embodiment has also been found to increase the ruggedness during short-circuit tests.

It is to be noted that, in any case, the depth of the intermediate electrical-contact region 120 is lower than the depth of the body region 105 in which it is contained. In other words, the intermediate electrical-contact region 120 is surrounded by the body region 105 which houses it.

The use of the region 120, which is deeper and with higher doping level than the source 108, solves the problem of the known art for the following reason. At a given voltage (which is fixed by physical parameters like the body doping level, the thickness of the substrate/epitaxial layer 102, and the deepness difference between the region 120 and the body 105), the electric field during use generates the punch-through of the junction n−/p/n+ (elements with reference numerals 102/105/120 in the drawings), thus leading to a uniform avalanche condition in the active area. This voltage is lower than the breakdown voltage BV that the body-drain junction can withstand by design. In this way, the Unclamped Inductive Switching (UIS) operation involves the entire active area. The MOSFET device 100 is more robust at UIS operation since the involved area in the breakdown voltage BV phenomena (e.g., the entire active area) is increased, facilitating a current density reduction at breakdown voltage BV.

The breakdown mechanism of embodiments in which the intermediate electrical-contact region 120 is deeper than the source regions 108 is different than in a case where the intermediate electrical-contact region 120 is at the same depth as the source regions 108. More particularly, where the intermediate electrical-contact region 120 is at the same depth as the source regions 108, the electric field reaches a critical value on the body-drain junction corner, leading to hole generation by impact ionization phenomena. The induced current is dominated by holes. In contrast, in embodiments in which the intermediate electrical-contact region 120 is deeper than the source regions 108, the electric field is lower than the critical value. The breakdown mechanism is thus controlled by the punch-through phenomena, leading to electron current flowing from drain to source.

As such, embodiments of the present disclosure in which the intermediate electrical-contact region 120 is deeper than the source regions 108 facilitate control of the breakdown voltage BV in the MOSFET device 100 active area, for example, by optimizing the residual body charge and moving the breakdown voltage BV phenomena from impact ionization to punch-through. The breakdown voltage BV is moved, for example, from an edge termination to each elementary cell of the active area, which provides higher robustness of the MOSFET device 100 at UIS. As to the manufacturing process of the intermediate electrical-contact region 120, reference is made to FIGS. 3A-3C, which show a portion of a semiconductor wafer limited to the features of the same that are useful to understand the present disclosure. Elements common to those already described with reference to FIG. 2 are indicated with the same reference numerals and not further described.

Figure 3A:
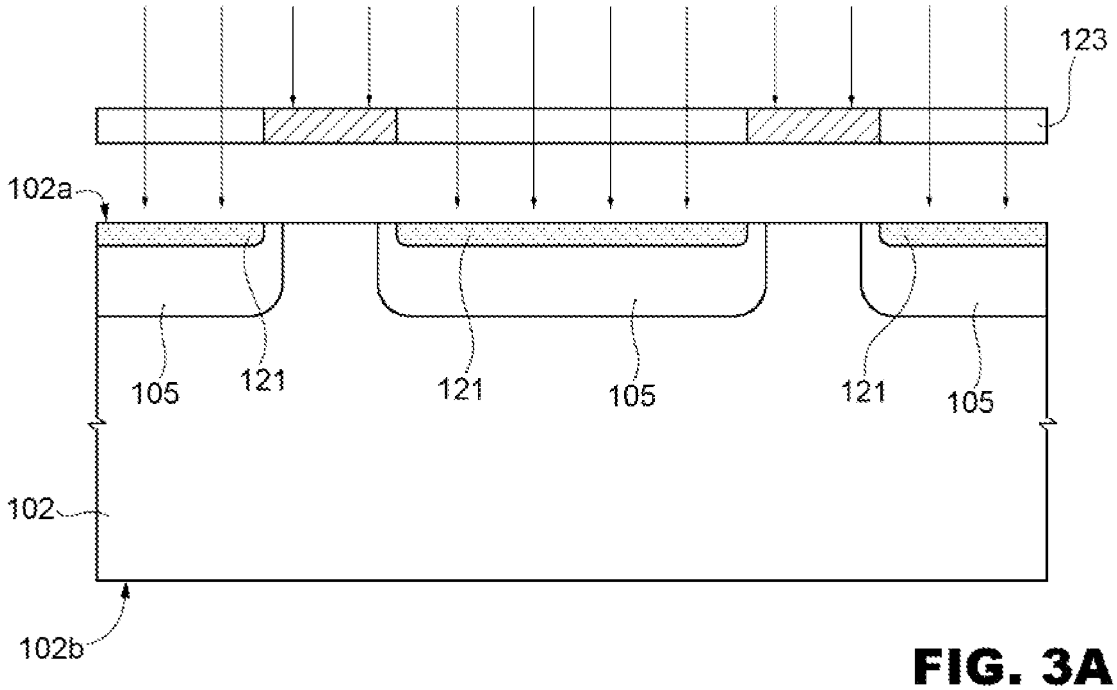
FIGS. 3A-3C show process steps to manufacture the MOSFET device of FIG. 2.

With reference to FIG. 3A, after having formed the body regions 105 through an implant of P doping species, a first masked implant of N-type species (e.g., Antimony, Arsenic or Phosphorus) is carried out, in order to form a first implanted region 121 within the body regions 105. This first implant (shown by means of arrows in FIG. 3A) is carried out with implant energy in the range 20-200 keV. A mask 123 used for this implant is only schematically depicted in FIG. 3A, and leaves exposed superficial portions of the semiconductor body 102 corresponding to the regions where source regions 108 and the intermediate electrical-contact region 120 are to be formed.

Figure 3B:
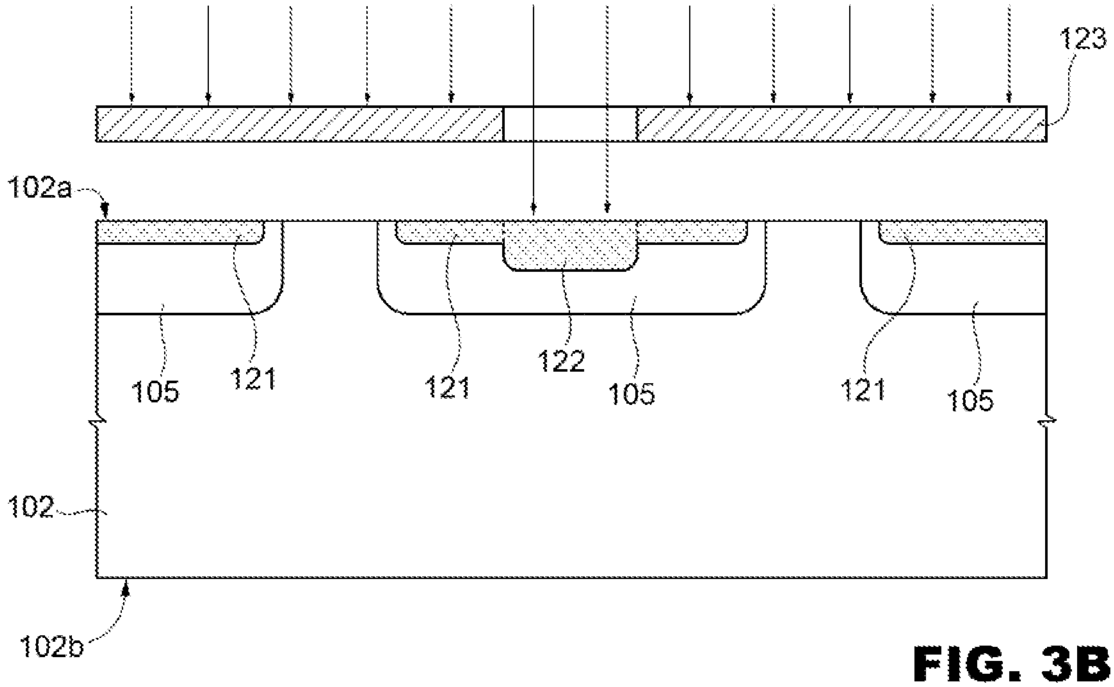

Then, FIG. 3B, a second masked implant of N-type species (e.g., Antimony, Arsenic or Phosphorus) is carried out, in order to form a second implanted region 122 within the body region(s) 105 designed to house the intermediate electrical-contact region 120. This second implant (shown by means of arrows in FIG. 3B) is carried out with implant energy higher than the energy used for the first implant of FIG. 3A, up to 300 keV. A mask 127 used for the second implant leaves exposed superficial portions of the semiconductor body 102 corresponding to the regions where only the intermediate electrical-contact region 120 is to be formed. Since the implant energy is higher, the implanted species reach a depth, in the semiconductor body 102, higher that the depth reached during the first implant.

Figure 3C:
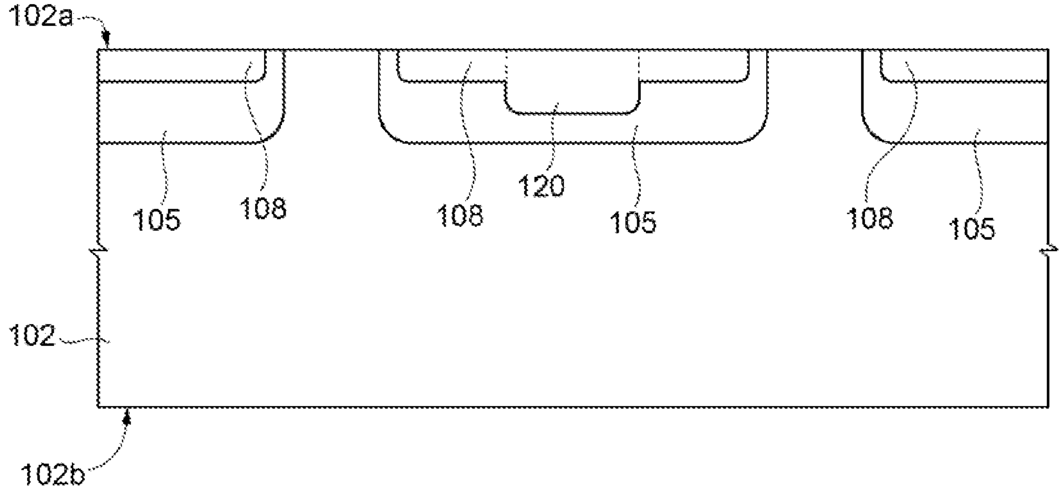

Then, FIG. 3C, an annealing step is carried out, to favor the diffusion of all the implanted species of regions 121, 122, thus forming the source regions 108 and the intermediate electrical-contact region 120. The annealing is carried out at temperature in the range 1600-1800° C.

After the annealing step, the first and the second implanted regions 121, 122 form one single implanted and diffused region, that, in turn, forms the intermediate electrical-contact region 120 in direct electrical contact with two source regions 108 at its opposite sides along X direction.

According to a further embodiment, not shown, after the first implant to form the source regions 108, a first annealing step is carried out to diffuse the dopant species thus implanted. Then, the second implant is carried out and a further second annealing step is carried out to diffuse the dopant species thus implanted.

It is apparent that the source regions 108 and the intermediate electrical-contact region 120 may be formed through a number of implants higher than what has been described. For example, the source regions 108 may be formed by two or more subsequent implants, and the intermediate electrical-contact region 120 may be formed by three or more subsequent implants (at least two of which are common to the formation of the source regions 108).

From an examination of the characteristics of the disclosure provided according to the present disclosure the advantages that it affords are evident.

In particular, by introducing an internal voltage clamp in the elementary cell of the MOSFET structure, it is possible to make the breakdown phenomenon to occur in the entire active area, thus maximizing the area involved in all the situations when device is requested to work in avalanche mode.

When avalanche mode is reached, the electrical field is lower than in standard solution, allowing better avalanche performance.

Furthermore, the breakdown voltage is more uniform across the MOSFET structure, because it overcomes the variability of the breakdown voltage value which is usually experienced at the edges of the device.

Finally, it is clear that modifications and variations may be made to what has been described and illustrated herein, without thereby departing from the scope of the present disclosure, as defined in the annexed claims.

For example, the embodiments previously disclosed refer to a N-channel MOSFET. However, the present disclosure can be applied, as apparent to the skilled person, to a P-channel MOSFET as well.

Figure 4:
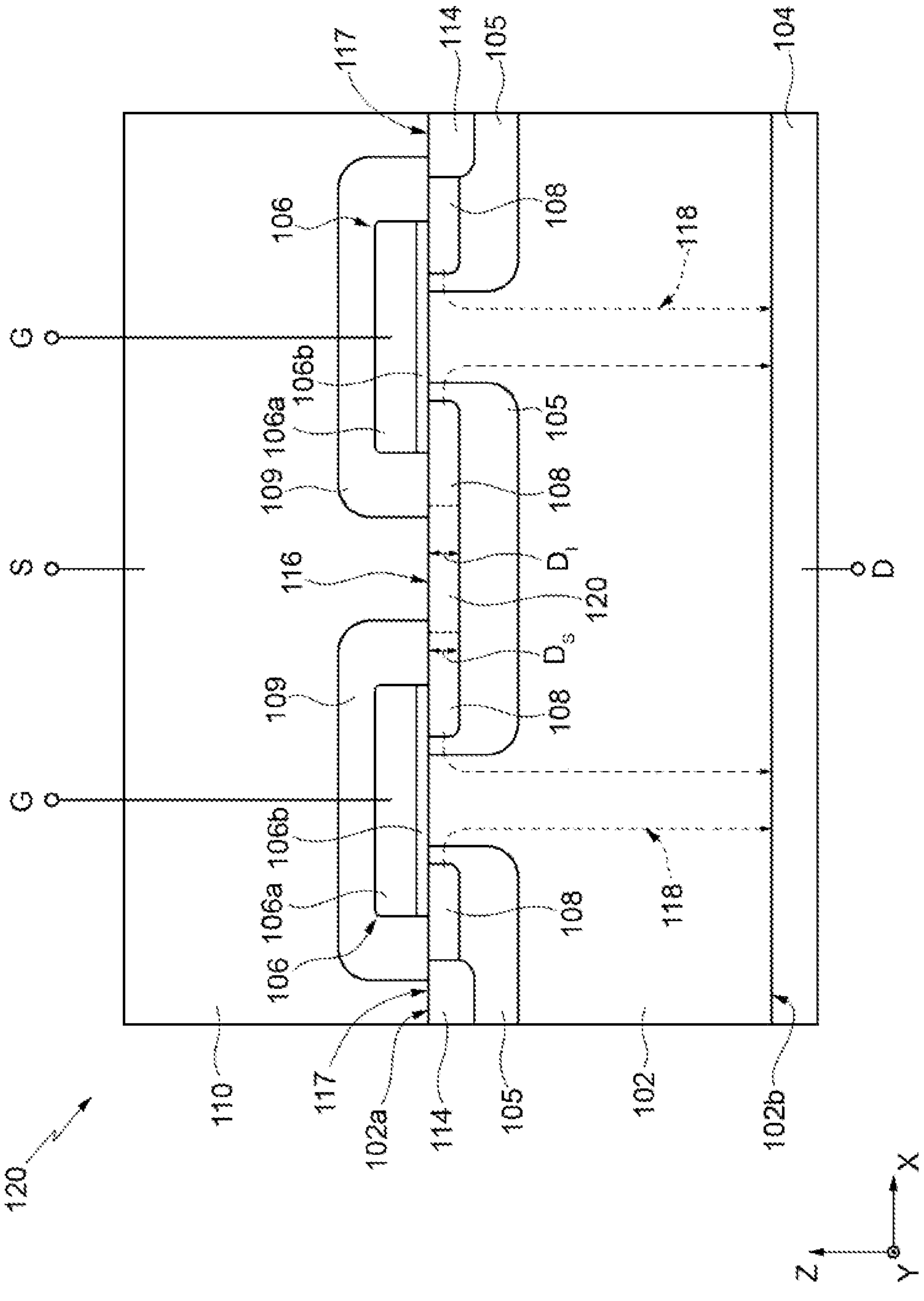
FIG. 4 shows a MOSFET device according to a further embodiment of the present disclosure.

In a further embodiment, shown in FIG. 4, a MOSFET device 120 is shown. Elements of FIG. 4 which are common to those of FIG. 2 are referenced with the same reference numerals and not further described.

In the MOSFET device 120, the intermediate electrical-contact region 120 and the source region(s) 108 extend in the semiconductor body 102 for a same depth (i.e., $D_I = D_S$ or $D_I \approx D_S$). However, the intermediate electrical-contact region 120 has a doping level (doping concentration) which is higher than that of the source region(s) 108.

The doping level of the intermediate electrical-contact region 120 is in the range $1 \cdot 10^{19}$-$1 \cdot 10^{20}$ atoms/$cm^3$, while the doping level of the source regions 108 is in the range $1 \cdot 10^{18}$-$2 \cdot 10^{19}$ atoms/$cm^3$. In general terms, the doping level of the source regions 108 is from 1% to 20% of the doping level of the intermediate electrical-contact region 120). The actual values are chosen in the indicated ranges, and do not overlap. Moreover, as said, in this embodiment, the depth $D_I$ of the intermediate electrical-contact region 120 is the same as the depth $D_S$ of source regions 108. For example, the depths $D_S$ and $D_I$ are in the range 0.2-0.4 μm.

This embodiment has been found to increase the ruggedness during short-circuit tests. In fact, the structure of FIG. 4 allows to modulate the saturation current of the MOSFET device 120 without impacting undesirably on the output resistance of the MOSFET device 120.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a MOSFET device, comprising:

forming a source terminal, including:

implanting, at a first face of a semiconductor body, a doped region, and forming a metal layer on the first face of the semiconductor body and electrically coupled to the doped region; and forming a drain terminal at a second face of the semiconductor body that is opposite the first face along a direction, wherein the implanting the doped region includes:

forming a first sub-region having a first doping concentration and a first maximum depth in the semiconductor body, the forming the first sub-region including performing a first implant of dopant species having a first type of conductivity with a first implant energy; and forming a second sub-region having a second doping concentration and a second maximum depth in the semiconductor body, the forming the second sub-region including performing said first implant and, thereafter, performing a second implant of dopant species having the first type of conductivity with a second implant energy higher than the first implant energy, wherein at least one of the second doping level and the second maximum depth has a value which is higher than a respective value of the first doping level and the first maximum depth, and the forming said metal layer includes forming the metal layer in electrical contact with the source terminal exclusively through said second sub-region, the metal layer being in direct physical contact with the source terminal at only the second sub-region of the source terminal.

2. The method of claim 1, wherein:

the first doping concentration has a value in a range of $1\cdot10^{18}$-$1\cdot10^{20}$ atoms/cm$^3$, the second doping concentration is higher than the first doping concentration and has a value in a range of $1\cdot10^{19}$-$1\cdot10^{20}$ atoms/cm$^3$, the first maximum depth has a value in a range of 0.2-0.4 μm, and the second maximum depth has a value in a range of 0.6-0.7 μm.

3. The method of claim 1, wherein:

the first doping concentration has a value in a range of $1\cdot10^{18}$-$2\cdot10^{19}$ atoms/cm$^3$, the second doping concentration is higher than the first doping concentration and has a value in a range of $1\cdot10^{19}$-$1\cdot10^{20}$ atoms/cm$^3$, and the first maximum depth is equal to the second maximum depth in a range of 0.2-0.4 μm.

4. The method of claim 1, wherein:

the first doping concentration has a value in a range of $1\cdot10^{19}$-$1\cdot10^{20}$ atoms/cm$^3$, the second doping concentration is equal to the first doping concentration, the first maximum depth has a value in a range of 0.1-0.2 μm, and the second maximum depth is higher than the first maximum depth and has a value in a range of 0.2-0.4 μm.

5. The method of claim 1, wherein:

the first doping concentration has a value in a range of $1\cdot10^{18}$-$2\cdot10^{19}$ atoms/cm$^3$, the second doping concentration is higher than the first doping concentration and has a value in a range of $1\cdot10^{19}$-$1\cdot10^{20}$ atoms/cm$^3$, the first maximum depth has a value in a range of 0.1-0.4 μm, and the second maximum depth has a value in a range of 0.2-0.4 μm.

6. The method of claim 1, wherein:

the first doping concentration has a value in a range of $1\cdot10^{18}$-$2\cdot10^{19}$ atoms/cm$^3$, the second doping concentration is higher than the first doping concentration and has a value in a range of $1\cdot10^{19}$-$1\cdot10^{20}$ atoms/cm$^3$, the first maximum depth has a value in a range of 0.1-0.4 μm, and the second maximum depth has a value in a range of 0.6-0.7 μm.

7. The method of claim 1, wherein the first sub-region and the second sub-region are formed in direct reciprocal electrical contact.

8. The method of claim 1, further comprising forming a gate structure on the first face of the semiconductor body, the forming the gate structure including:

forming a gate dielectric layer;

forming a metal gate layer on the gate dielectric layer; and completely surrounding an upper surface and lateral surfaces of the metal gate layer with an insulating layer, said gate structure completely covering the first sub-region.

9. The method of claim 1, wherein said semiconductor body is of 4H—SiC.

10. A method, comprising:

forming a doped region at a first surface of a semiconductor body, including:

forming a first sub-region having a first doping concentration, the first sub-region extending into the semiconductor body from the first surface to a first depth, the forming the first sub-region including performing a first implant of dopant species having a first type of conductivity with a first implant energy; and forming a second sub-region having a second doping concentration, the second sub-region extending into the semiconductor body from the first surface to a second depth, wherein the second depth is greater than the first depth, the forming the second sub-region including performing the first implant and performing a second implant of dopant species having the first type of conductivity with a second implant energy higher than the first implant energy; and forming a first metal layer on the first surface of the semiconductor body and electrically coupled to the doped region.

11. The method of claim 10, further comprising:

forming a second metal layer at a second surface of the semiconductor body that is opposite the first surface.

12. The method of claim 10, wherein the first metal layer directly contacts only the second sub-region of the doped region.

13. The method of claim 10, wherein forming the doped region, includes implanting the doped region in the semiconductor body.

14. The method of claim 10, wherein the semiconductor body includes 4H—SiC.

15. The method of claim 10, comprising a plurality of gate structures on the first surface of the semiconductor body, the first metal layer being on each of the plurality of gate structures.

16. The method of claim 15, wherein each gate structure includes a gate dielectric layer on the first surface of the semiconductor body and a gate conductive layer on the gate dielectric layer.

* * * * *